United States Patent [19]

Hotta et al.

[11] Patent Number: 4,851,845
[45] Date of Patent: Jul. 25, 1989

[54] ENCODER

[75] Inventors: Masao Hotta, Hanno; Kenji Maio, Suginami; Toshihiko Shimizu, Setagaya, all of Japan

[73] Assignee: Hitachi, Ltd., Tokyo, Japan

[21] Appl. No.: 185,264

[22] Filed: Apr. 18, 1988

Related U.S. Application Data

[63] Continuation of Ser. No. 743,973, Jun. 12, 1985.

[30] Foreign Application Priority Data

Jun. 14, 1984 [JP] Japan .................................. 59-120847

[51] Int. Cl.4 ............................................ H03M 1/36
[52] U.S. Cl. .................................... 341/159; 341/155; 341/158; 341/200; 307/467
[58] Field of Search ................... 340/347 AD, 347 M; 307/467, 445; 341/155, 158, 159, 200

[56] References Cited

U.S. PATENT DOCUMENTS 4,270,118 5/1981 Brokaw ........................ 340/347 AD Primary Examiner—William M. Shoop, Jr.
Assistant Examiner—Brian Young
Attorney, Agent, or Firm—Antonelli, Terry & Wands

[57] ABSTRACT

A parallel (flashed) type analog-to-digital converter is provided which is fabricated on a single integrated-circuit chip. An input analog voltage is compared with respective reference voltages by a number of comparators. A change position of an output pattern (for example, a thermometer format signal) of the comparators is detected by a number of exclusive OR circuits. The exclusive OR circuits are grouped into several groups, and in each group, the output transistors of respective exclusive OR circuits are connected to separate bit lines. Several sets of separate bit lines are connected to one set of output bit lines through emitter followers or diodes so that parasitic capacitances related to the output transistors are reduced.

2 Claims, 6 Drawing Sheets

ENCODER

This application is a continuation of application Ser. No. 743,973, filed on June 12, 1985.

BACKGROUND OF THE INVENTION

The present invention relates to an encoder and, more particularly, to an encoder which is suitable for use as the coding circuit of a parallel (flash) type high-speed AD converter (which will hereinafter be referred to as a "ADC").

Generally speaking, as shown in FIG. 9 parallel type ADCS are constructed, of a $(2^n-1)$ number of comparators 1 for comparing the reference voltages $V_j$ divided into $(2^n-1)$ levels with an analog input voltage $V_{IN}$ together with an encoder 2 for converting the output patterns of those comparators 1 into binary codes, where the letter n designates the number of output bits. Reference should be made to: (1) J. Peterson, "A monolithic Video A/D Converter", IEEE J. of Solid-Stage Circuit, vol. SC-14, No. 6, 1979; and (2) T. Takemoto et al., "A Fully Parallel 10 bit A/D converter with Video Speed", J. of Solid-State Circuit, Vol. SC-17. All the outputs of such, comparators take a high potential (which hereafter referred to as an "H"), in case the reference voltages $V_j$ are lower than the input voltage $V_{IN}$, and a low potential (hereafter referred to as an "L") in the contrary case. The outputs of each pair of comparators made receptive of the reference voltages at the adjacent levels are examined by an exclusive OR circuit 2a in the encoder 2. As a result, only the exclusive OR circuit 2a corresponding to the position, in which the outputs of a series of comparators 1 change from the "L" to the "H", generates an "H" output, and all the others generate an "L" output. In other words, the exclusive OR circuit generating that "H" level corresponds to the level of the input voltage $V_{IN}$. That "H" output is fed to an OR circuit 2b corresponding to each "1" bit position of the binary codes for expressing that level.

As the above-specified encoder constructed of the exclusive OR circuits 2a and the OR circuits 2b, there has been widely adopted, because of its remarkably simple circuit construction, a structure in which the outputs of the exclusive OR circuits are generated from the collectors of differential switching circuits and are fed to emitter-followers. The emitter-followers have emitters made receptive to the respective outputs of the exclusive OR circuits, and have their emitters connected mutually into a wired OR structure, as shown in FIG. 5. In this structure, the parasitic capacitance at the final stage creates a problem. If the output has 8 bits, for example, the number of transistors $Q_3$ to be connected in parallel with one output bit line 21 may be as many as $2^7=128$. The combined parasitic capacitances for the 128 circuits such as the emitter-base and base-collector capacitances of the transistors $Q_3$ composing the emitter-follower or the collector-substrate capacitances of transistors $Q_2$ relate to the output bit line 21. If the composed parasitic capacitance of one circuit is 0.1 to 0.2 pF. the total parasitic capacitance $C_{eq}$ related to the output bit line 21 may be as high as 10 to 20 pF. The load resistance RE of the emitter-follower cannot be made so low in relation to the power to be consumed or in relation to the driving ability of the previous stage circuit, and it may reach several K$\Omega$, if the current to be fed to the transistors $Q_3$ is 1 mA and if the voltage of $(V_{CC}-V_{EE})$ is 5 V. If the load resistance is assumed to be 5 $\Omega$, its time constant $\tau$ with the total parasitic capacitance $C_{eq}$ reaches a value of 50 to 100 ns, which greatly restricts the speed of the whole ADC so that this speed is limited to several tens of MHz no matter how fast the comparators 1, the exclusive OR circuits and other circuits might be speeded up.

SUMMARY OF THE INVENTION

It is, therefore, an object of the present invention to provide an encoder characterized in that, unlike the prior art, the wired ORs are not taken directly from the whole emitter-follower stage Instead, the emitter-follower has its transistors divided into several groups each of which has its own transistors connected temporarily at their emitters with one another. The mutual nodes are connected with a common bit output terminal through separating means (such as differential switching circuits and emitter-followers, emitter-followers or diodes). Thanks to this construction, the aforementioned parasitic capacitance is dispersed so as to remarkably reduce the effective time constant so that the operating speed is remarkably improved.

DESCRIPTION OF THE PREFERRED EMBODIMENTS

Figure 1:
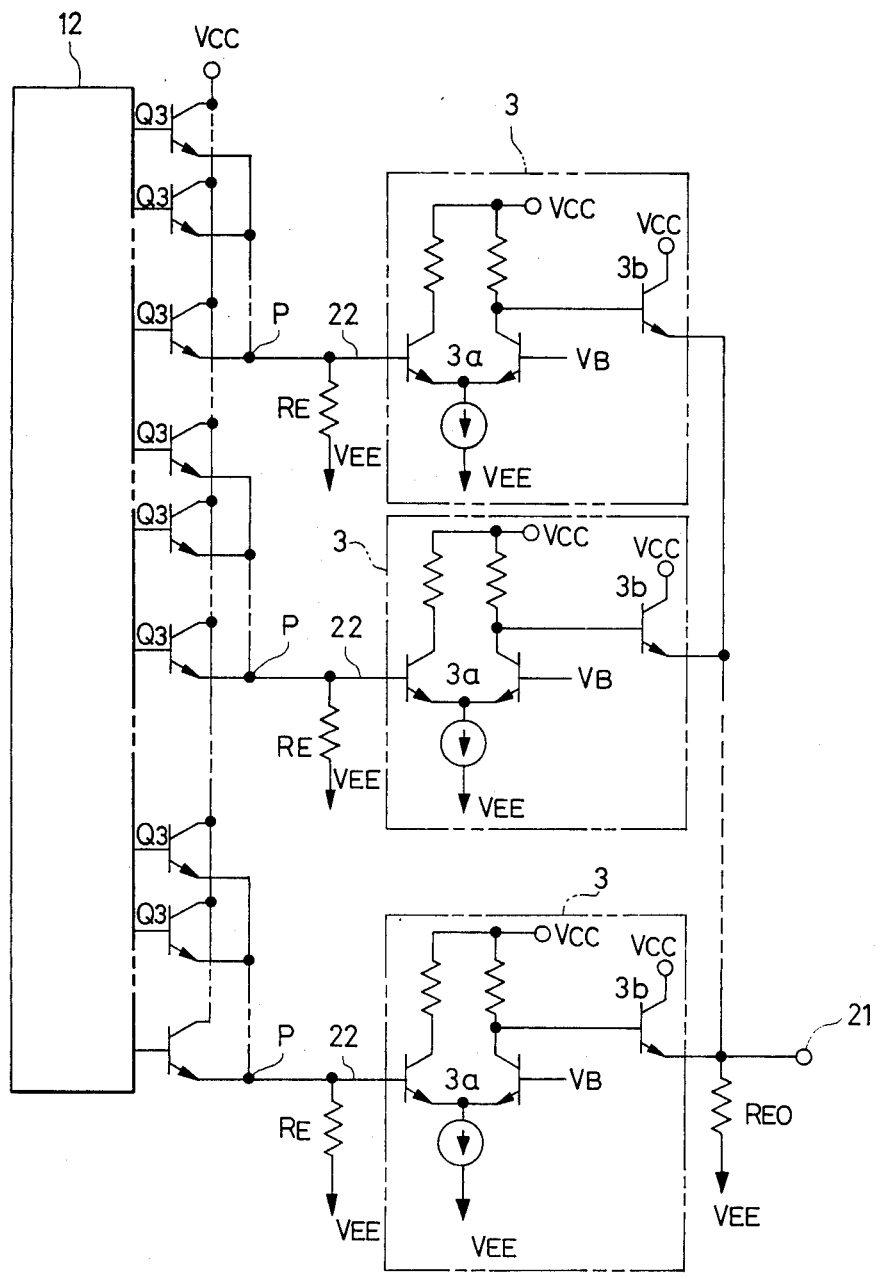
FIGS. 1 to 3 are circuit diagrams showing the essential portions of first to third embodiments of the present invention, respectively.
Figure 9:
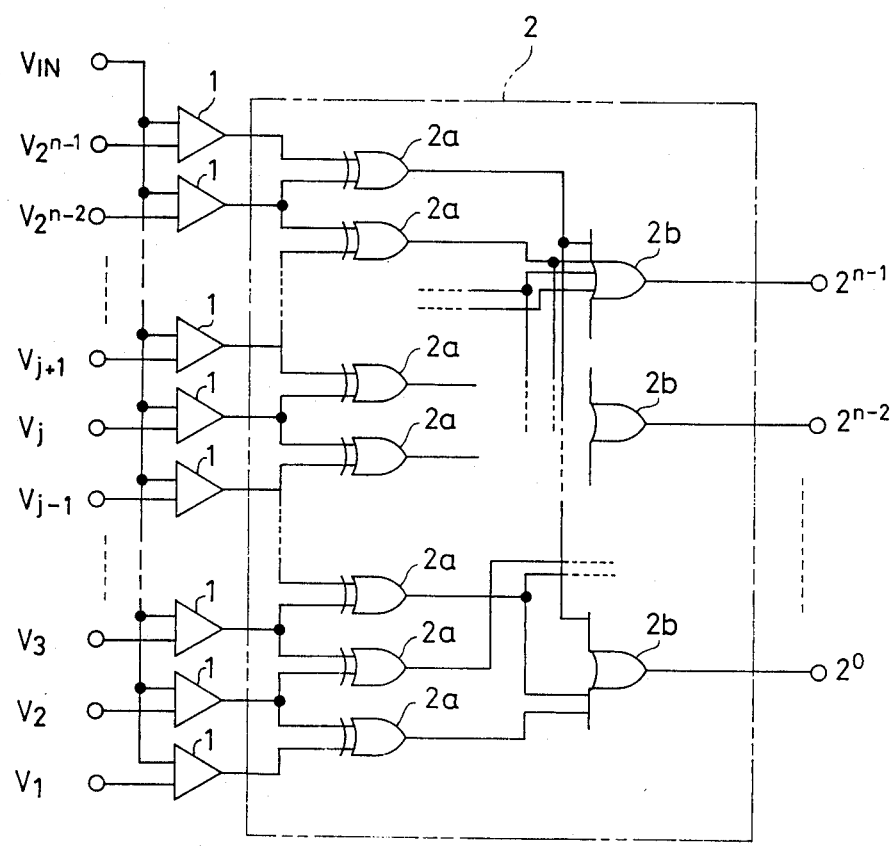
FIG. 9 is a logic circuit diagram showing the parallel type ADC.

FIG. 1 shows the first embodiment of the present invention in connection with one output bit line 21. A block 12 corresponds to a portion which is composed of the comparators 1 and the exclusive OR circuits 2a of FIG. 9. The numerous transistors $Q_3$ of the emitter-follower stage are divided into a suitable number of groups, each of which has the wired OR connection. The wired OR outputs 22 of the respective groups are OR-coupled again through respective separating means 3. In the present embodiment, each of the separating means 3 is composed of a differential switching circuit 3a and an emitter-follower 3b which is made receptive of the non-reversed output of the switching circuit 3a. The outputs of the emitter-followers 3b are wired again in the OR connection.

If the transistors $Q_3$ are divided into N groups, the total parasitic capacitance at a node P may be reduced to 1/N of the value when the transistors are wired in the OR connection, and the time constant is also reduced to 1/N. If it is assumed that N=4, for example, at the aforementioned ADC of the 8 bit output, the time constant at the node P takes a value of 12 to 25 ns, which is smaller by 38 to 75 ns than that of the prior art. Moreover, the differential switching circuit 3a in the separating means 3 has a sufficiently high operating speed because it is of the unsaturated type. The wired OR connection at the final stage has its time constant reduced to N/T in relation to the value of the whole wired OR connection, if the total number of the transistors $Q_3$ is designated as T, because the number of the transistors to be connected is N. In the aforementioned case of N=4 for the 8 bit output, the time constant may be reduced to as low as 1.5 to 3 ns. As a result, the total delay time of the circuit downstream from the separating means 3 can be easily suppressed to 10 ns or less, even if it includes the delay time of the separating means themselves, so that the speed of the circuit in its entirety can be prominently improved.

Figure 2:
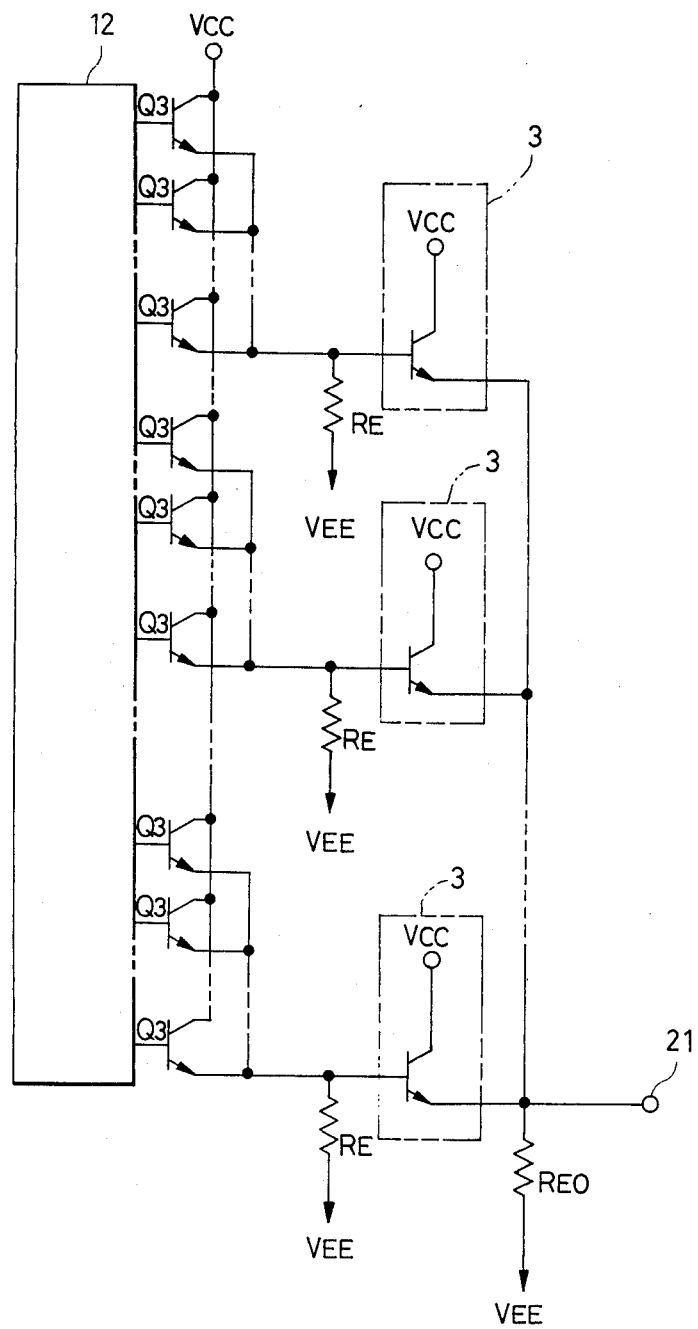

FIG. 2 shows the same portion of the second embodiment of the present inventions as that of FIG. 1. In the present embodiment, the separating means is constructed of a one-stage emitter-follower, and the effect of reducing the delay due to parasitic capacitance is substantially the same as that in FIG. 1. Here, in this construction, the output level of the output bit line 21 is made lower by the base-emitter voltage of the transistors than the case (i.e., the intrinsic ECL level) of FIG. 1. In the integrated ADC, however, it is customary to provide an output buffer such as a latch in the IC thereby to extract a digital output from the output buffer. Since the level shift can be conducted in that output buffer, the aforementioned drop in the level does not present any problems in practice.

Figure 3:
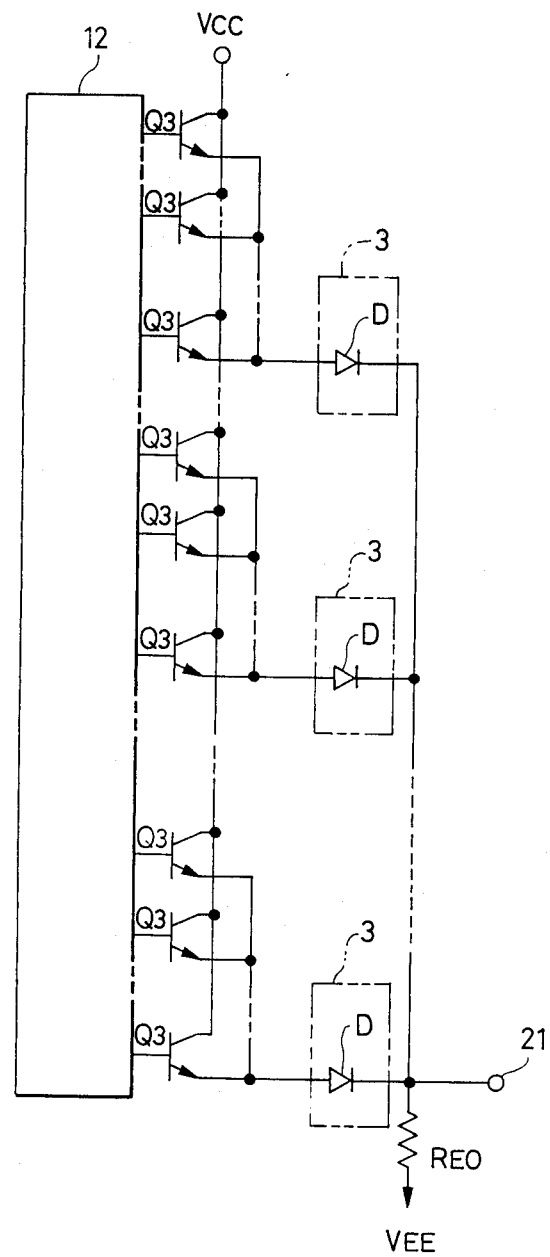

FIG. 3 shows the same portion of the third embodiment of the present invention as that of FIG. 1. In the present embodiment, diodes D are used as the separating means 3, and the wired OR outputs of the respective groups of the previous stage are connected through the forward diodes D with a common load $R_{EO}$. If the wired OR output of a certain group of the previous stage takes the level "H", only the diode D connected therewith is rendered conductive whereas the other diodes D are inversely biased into the non-conductive state.

Figure 4:
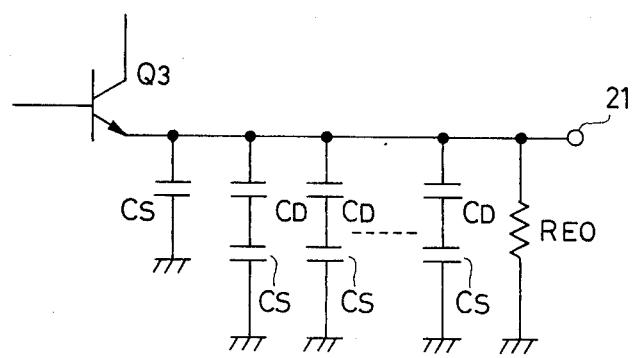
FIG. 4 is a diagram showing an equivalent circuit of the parasitic capacitance of the circuit of FIG. 3.
Figure 5:
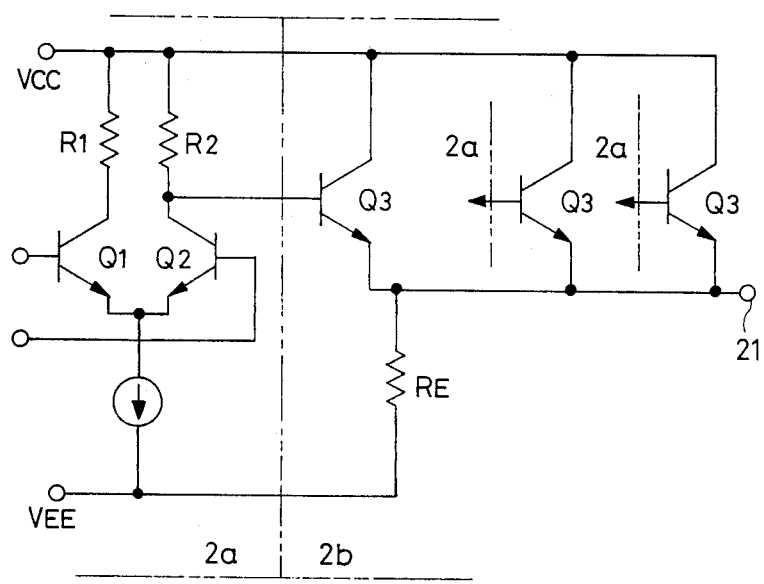
FIG. 5 is a diagram showing the wired OR circuit in the encoder of the prior art.

In this state, the equivalent circuit of the parasitic capacitance concerning the output bit line 21 is shown in FIG. 4. In this Figure, letters $C_S$ indicate the composed parasitic capacitances of the respective groups of the transistors $Q_3$, and letters $C_D$ indicate the capacitances of the diodes D in the reversed bias stage. The parasitic capacitance $C_S$ of the group of the transistors $Q_3$, in which the wired OR output takes the level "H", is connected directly with the output bit line 21 because the diode D connected therewith is rendered conductive. In the other group of the transistors $Q_3$, however, since the diode D connected therewith is non-conductive, the capacitances $C_D$ and $C_S$ are connected in series with the output bit line 21. Since $C_S >> C_D$ for relatively small value N, the combined capacitance of $C_D$ and $C_S$ is substantially equal to $C_D$ so that the total parasitic capacitance of the output bit line 21 is approximately expressed by $C_S + (N-1)C_D$. Without the diodes D, that total parasitic capacitance would be expressed by $NC_S$. As compared with this, therefore, the parasitic capacitance is remarkably reduced by inserting the diodes D so that the speed of the encoder is remarkably improved. In this embodiment, too, the level of the output bit is reduced by the forward voltage of the diodes D to a value lower than the ECL level but this presents no serious problems for the same reasons described in the second embodiment.

The second and third embodiments can be easily realized by a remarkably small number of elements, as shown in FIGS. 2 and 3. By devising the IC layout, therefore, the present invention, unlike the conventional method, can be realized without any increase in the IC area, using neither emitter-followers nor diodes. This realization is exemplified in FIGS. 6.

Figure 6:
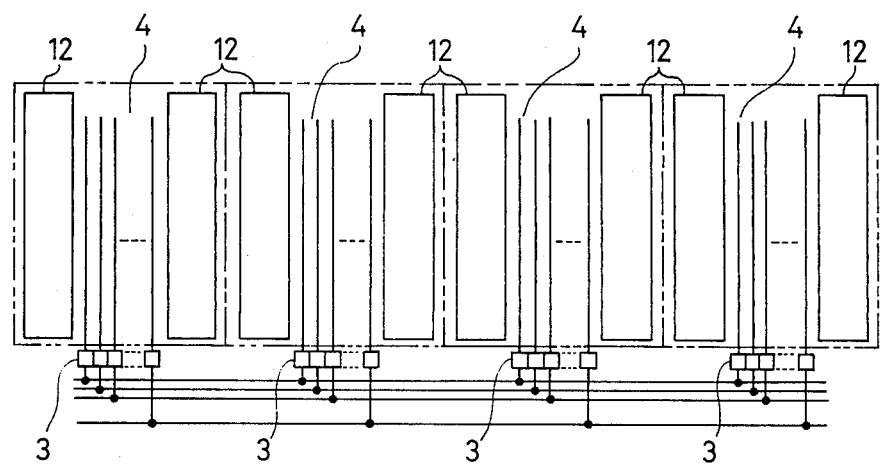
FIG. 6 is a layout showing the construction using the circuit of the present invention.

Generally in the case of the parallel ADC, as shown in FIG. 6, comparators and exclusive OR circuits 12 are divided and laid out into several blocks. FIG. 6 shows the case they are divided into four blocks. In one block, moreover, the comparators are divided in two and are opposed to facilitate extraction of the outputs. In FIG. 6, it is assumed that n-bit outputs are generated. In order to connect the respective blocks with the wired ORs, moreover, there are prepared an n number of lines. If these blocks are the divided groups described in connection with the first to third embodiments, the separating means 3 such as the emitter-follower circuits or the diodes may be arranged for each block and can be placed in the wiring regions of the output bit lines so that the area of the IC need not be effectively augmented.

Figure 7:
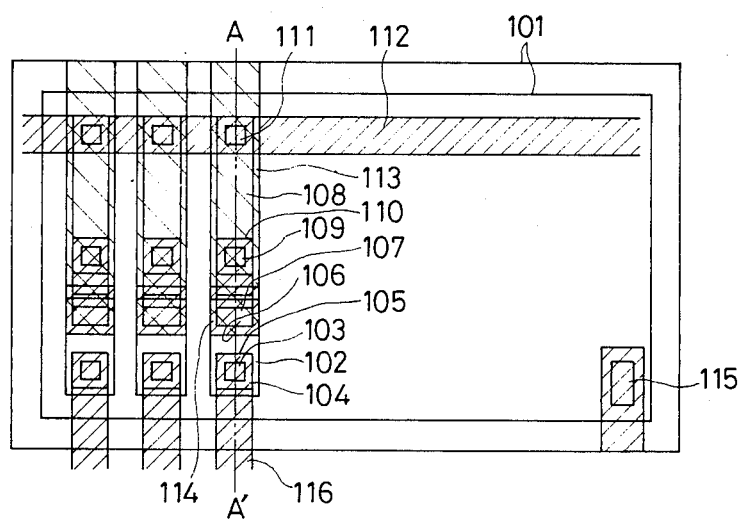
FIG. 7 is a layout showing the construction of the circuit of the second embodiment of the present invention.
Figure 8:
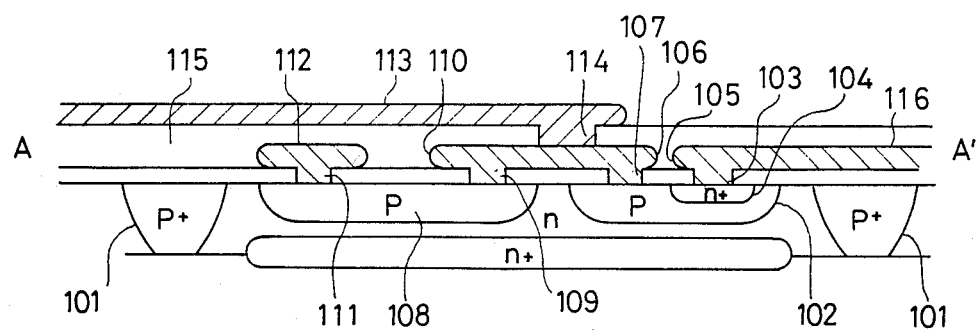
FIG. 8 is a section taken along line A-A' of FIG. 7.

Moreover, the emitter-follower circuit is composed, for each bit output line in the block, of one transistor and one resistor, and is composed of one diode in the system using the diodes described in the third embodiment. Therefore, those elements can be arranged just below the output bit line by using multi-layered wiring. This makes it possible to prevent the IC area from increasing due to the addition of the circuit considered. This specific layout is shown in FIG. 7 if the circuit described in the second embodiment is used. In FIG. 7, there is shown a structure in which the emitter-follower circuit (composed of one transistor and one resistor) of FIG. 2 is arranged just below an output bit line 113, that is to say, only three groups of an n-number of output bit lines and an n-number of emitter-follower circuit 3 connected with the output bit lines. On the other hand, a section taken along line A—A' is shown in FIG. 8. In FIG. 8: reference numeral 101 indicates an isolation layer for isolating the elements; numeral 102 a base diffusion region; numeral 103 an emitter contact; numeral 104 an emitter diffusion region; numeral 105 an emitter aluminum line (or the first layer); numeral 106 a base aluminum line (or the first layer); numeral 107 a base contact; numeral 108 a resisting base diffusion; numeral 109 one contact of the resistor; numerals 110 and 112 aluminum lines (or the first layer) to be connected with the resistor; numeral 111 the other contact of the resistor; numeral 113 a bit output line (or the second layer); numeral 114 a through hole for connecting the first and second layer aluminum lines; and numeral 115 an interlayer insulating film. In this layout example, the respective transistors have all their collectors shared, as at $V_{CC}$, and are fabrictted by making a base diffusion into the common n layer. As a result, the base diffusion is realized with a width of about 15 microns. Considering that the second layer aluminum line has a width of about 5 to 10 microns and a gap of about 3 to 15 microns, therefore, the emitter-follower circuit can be arranged with the wiring pitch just below the second layer aluminum line. As a result, by using the emitter-follower circuit as the separating means for the respective groups, the influence of parasitic capacitance can be reduced without any increase in the chip area of the IC so that a highly economical effect can be attained. Moreover, the bit output line uses the second layer line, as shown in FIGS. 7 and 8, the wiring capacitance is smaller than that of the first layer so that the capacitance reduction is conveniently effected. In FIGS. 7 and 8, the aluminum line 112 corresponds to the $V_{EE}$ of FIG. 2, and the aluminum line 116 corresponds to the output line 21 of FIG. 2. Numeral 115 indicates a contact for connecting the collector of the transistor and the island of the resistor with the $V_{CC}$.

If the diodes shown in FIG. 3 are used as the third embodiment, moreover, one diode serves as the separating means and is generally constructed by connecting the collector and base of a transistor. Since this transistor has a width of 10 to 20 microns, it can be arranged just below the second layer aluminum line of the bit output line, and the chip size of the IC is not accordingly augmented to provide a highly economical effect.

As has been described hereinbefore, according to the present invention, by adding a small number of elements, the delay time of the wired OR stage can be remarkably shortened so that the speed of the encoder is remarkably improved. This speed is important, especially in the parallel type ADC. Since the parallel type ADC employs considerable hardware to achieve the high speed by connecting a number of comparators 1 in parallel, it is undersirable that the speed of the coding logic stage be a major factor in limiting the speed of the ADC as a whole. The present invention is significant in that it can substantially eliminate that limitation.

What is claimed is:

1. A parallel type n-bit analog-to-digital converter, comprising:
   a voltage driving means to provide reference voltages of $2^n-1$ graduated levels wherein "n" represents the number of output bits,
   a plurality of quantizing circuits comprising $2^n-1$ comparators and $2^n-1$ exclusive OR circuits, wherein each of said comparators compares an input voltage with each of said reference voltages, and wherein each of said exclusive OR circuits has an output transistor, and each inputs outputs of two comparators, by which said analog input voltage is compared with reference voltages of two adjacent levels, within said $2^n-1$ comparators for detecting a change position of an output pattern of said plurality of comparators, wherein said quantizing circuits are divided into a plurality of first blocks, and wherein the quantizing circuits are further divided into two opposed second blocks within each of said first blocks;
   a plurality of sets of n-bit separate bit lines, each set being respectively arranged between said two opposed second blocks within one of said first blocks for connecting emitters of output transistors of said exclusive OR circuits within each of said first blocks according to a binary code expressing the level of each change position to be detected by each of said exclusive OR circuits; and
   emitter follower circuits for connecting said plurality of sets of separate bit lines in parallel to one set of n-bit output bit lines which are arranged in the perpendicular direction of said separate bit lines and for separating parasitic capacitance related to each set of separate bit lines, whereby said emitter follower circuits can be placed in the wiring regions of said output lines.

2. A parallel type n-bit analog-to-digital converter, comprising:
   a voltage driving means to provide reference voltages of $2^n-1$ graduated levels wherein "n" represents the number of output bits,
   a plurality of quantizing circuits comprising $2^n-1$ comparators and $2^n-1$ exclusive OR circuits, wherein each of said comparators compares an input voltage with each of said reference voltages, and wherein each of said exclusive OR circuits has an output transistor, and each inputs outputs of two comparators, by which said analog input voltage is compared with reference voltages of two adjacent levels, within said $2^n-1$ comparators for detecting a change position of an output pattern of said plurality of comparators, wherein said quantizing circuits are divided into a plurality of first blocks, and wherein the quantizing circuits are further divided into two opposed second blocks within each of said first blocks;
   a plurality of sets of n-bit separate bit lines, each set being respectively arranged between said two opposed second blocks within one of said first blocks for connecting emitters of output transistors of said exclusive OR circuits within each of said first blocks according to a binary code expressing the level of each change position to be detected by each of said exclusive OR circuits; and
   diodes for connecting said plurality of sets of separate bit lines in parallel to one set of n-bit output bit lines which are arranged in the perpendicular direction of said separate bit lines and for separating parasitic capacitance related to each set of separate bit lines, whereby said diodes can be placed in the wiring regions of said output lines.

* * * * *